(12) United States Patent
Barasinski et al.

(10) Patent No.: US 7,795,917 B2
(45) Date of Patent: Sep. 14, 2010

(54) HIGH-SPEED BUFFER CIRCUIT, SYSTEM AND METHOD

(75) Inventors: Sebastien Barasinski, Meylan (FR); Cyrille Dray, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 66 days.

(21) Appl. No.: 12/009,144

(22) Filed: Jan. 15, 2008

(65) Prior Publication Data

US 2008/0218211 A1 Sep. 11, 2008

(30) Foreign Application Priority Data

Jan. 15, 2007 (FR) .................................. 07 00267

(51) Int. Cl.
*H03K 19/0175* (2006.01)
*H03B 1/00* (2006.01)

(52) U.S. Cl. .............................. 326/83; 326/82; 326/86; 326/87; 327/108; 327/109

(58) Field of Classification Search ............. 326/82–87; 327/108, 109
See application file for complete search history.

(56) References Cited

U.S. PATENT DOCUMENTS 5,973,514 A * 10/1999 Kuo et al. ...................... 326/98
6,570,405 B1 * 5/2003 Lien .............................. 326/83
2002/0044012 A1 4/2002 Otsuka et al.
2005/0122141 A1 * 6/2005 Balhiser et al. ............. 327/112
2005/0189964 A1 * 9/2005 Itoh et al. ...................... 326/87
2007/0075743 A1 * 4/2007 Oh ................................ 326/83

OTHER PUBLICATIONS

French Search Report, Application Nos. FR 0700267 and FA 689684, Aug. 29, 2007, 2 pages.

* cited by examiner

*Primary Examiner*—Rexford N Barnie
*Assistant Examiner*—Thienvu V Tran
(74) *Attorney, Agent, or Firm*—Lisa K. Jorgenson; Paul F. Rusyn; Graybeal Jackson LLP

(57) ABSTRACT

A buffer circuit includes at least one part that is powered by a supply voltage by means of a first initialization transistor, and connected to the ground by means of a second initialization transistor. The circuit is capable of transferring, between an input and an output, an input signal including at least one rising edge and/or one falling edge. The circuit includes a first CMOS inverter, of which the input is connected to the input of the circuit, and of which the output is mounted in series with the input of a second CMOS inverter, with the output of the second CMOS inverter being connected to the output of the circuit. A circuit creates an overvoltage on one of the two inverters during operation.

26 Claims, 2 Drawing Sheets

HIGH-SPEED BUFFER CIRCUIT, SYSTEM AND METHOD

PRIORITY CLAIM

The present application claims the benefit of French Patent Application Ser. No. 07/00267, filed Jan. 15, 2007, which application is incorporated herein by reference in its entirety.

TECHNICAL FIELD

Embodiments of this invention relate to the field of buffer circuits, more commonly called buffers.

Buffers according to embodiments of the present invention may be used, for example, in the critical paths, and in particular in long electrical paths, and make it possible to transfer an input signal, so that this signal is not degraded along such long electrical paths.

BACKGROUND

A buffer is an electronic circuit including a first CMOS inverter and a second CMOS inverter mounted one behind the other, a CMOS inverter being an assembly of a PMOS transistor and an NMOS transistor sharing their gate and drain.

A buffer is therefore an electronic circuit that reproduces the logic state of an input signal on the output.

However, when the input signal changes states, there is a transient period, corresponding to the propagation time, in which the input and the output of the buffer have opposite values. This transient period corresponds to the time needed by the buffer to propagate and transmit, to the output, the change in state of the signal at the input.

So as not to degrade the time performance of an electronic system including a buffer, it is desirable for it to be as fast as possible.

To produce a high-speed buffer, it is known to use a stronger buffer. However, such a solution is limited on the one hand by a propagation time specific to the technology, and, on the other hand, because a larger buffer involves a larger transistor gate capacity and therefore a greater charging time.

As an alternative, it is possible to use transistors with a low threshold voltage. Such transistors are fast, but have higher leakage currents, presenting problems of static consumption.

In addition, to solve these consumption problems, it is known to use transistors with a standard threshold voltage or transistors with a high threshold voltage. Such transistors have lower leakage currents, but are slower.

SUMMARY

Embodiments of the present invention are directed to buffers that are both fast and have low leakage currents.

More specifically, embodiments of the invention relate to a buffer circuit of which at least one part is powered by a supply voltage by means of a first initialization transistor, and connected to the ground by means of a second initialization transistor. The circuit is capable of transferring, between an input and an output, an input signal including at least one rising edge and/or one falling edge. The circuit includes a first CMOS inverter, of which the input is connected to the input of the circuit, and of which the output is mounted in series with the input of a second CMOS inverter, with the output of the second CMOS inverter being connected to the output of the circuit.

A buffer circuit according to one embodiment of the invention includes means for creating an overvoltage on the two CMOS inverters. More specifically, according to one embodiment of the invention the buffer circuit includes a first loop between the output of the second CMOS inverter and the input of the first CMOS inverter, wherein the first loop includes first means for creating an overvoltage one the two CMOS inverters, and/or a second loop between the output of the second CMOS inverter and the input of the first CMOS inverter, and wherein the second loop includes second means for creating an overvoltage on the two CMOS inverters.

By overvoltage, we mean a gate-source voltage on an inverter greater than the supply voltage.

The overvoltage of the second inverter improves the performance of the buffer circuit in embodiments of the present invention.

The means for creating an overvoltage preferably include electrical energy storage means and control means for selectively releasing the energy stored by the storage means.

This means that the first and second means for creating an overvoltage respectively can include first and second electrical energy storage means and first and second control means for selectively releasing the energy respectively stored by the first and second storage means.

Indeed, if an overvoltage is generated continuously, the buffer circuit deteriorates. With the selective release of stored electrical energy, the overvoltage is generated only for a given period, only for the time necessary, i.e. the propagation time of the buffer circuit (time of a rising/falling edge), which minimizes the risks of reliability problems, such as hot carrier degradation or gate oxide breakdown.

To this end, in one embodiment, the electrical energy storage means include a first capacitor mounted between the control means and the first CMOS inverter.

In other words, the first electrical energy storage means can include a first capacitor mounted between the first control means and the first CMOS inverter, and the second electrical storage means include a second capacitor mounted between the second control means and the first CMOS inverter.

In addition, the electrical energy storage means can include a second capacitor mounted between the control means and the CMOS inverter.

The control means preferably include a first NOR gate of which the output is connected to the gate of the first initialization transistor, and of which one of the inputs is connected to the input of the circuit, while the other input is connected to the inverted output of the circuit.

In another embodiment, the control means also include a second NAND gate of which the output is connected to the gate of the second initialization transistor, and of which one of the inputs is connected to the input of the circuit, while the other input is connected to the inverted output of the circuit.

Such control loops advantageously enable the overvoltage to be generated for very short periods.

With this configuration, it is possible to increase the speed of the buffer and to have a variable increase, without any particular control signal.

The control means are advantageously configured so as to selectively release the energy stored by the storage means at most during the time, respectively, of a rising edge or of a falling edge of the input signal.

With this configuration, the problems of reliability associated with the creation of an overload beyond the limits of the technology are reduced.

Advantageously, the input and output voltages of the buffer are between 0 and VDD, and the overloads are generated only inside the buffer circuit.

The input connected to the input of the circuit of the first NOR gate has a high threshold voltage, while the input connected to the inverted output of the circuit has a low threshold voltage, and/or the input connected to the input of the circuit of the second NAND gate has a low threshold voltage, while the input connected to the inverted output of the circuit has a high threshold voltage.

With this configuration, the overvoltage is created only for the time of a rising/falling edge.

According to embodiments of the invention, the value of the overvoltage is less than or equal to twice the value of the supply voltage VDD of the circuit.

According to another embodiment of the invention, a method for transferring an input signal including at least one rising edge and/or one falling edge between an input and an output of a buffer circuit powered by a supply voltage VDD. The method includes inverting the input signal by a first CMOS inverter, of which the input is connected to the input of the circuit, and inverting the signal at the output of the first inverter by a second CMOS inverter of which the input is series-mounted with the output of the first inverter and the output is connected to the output of the circuit.

According to one embodiment of the invention, the method includes a step consisting of creating an overvoltage on the two CMOS inverters.

In one embodiment, the method also includes a step consisting of activating the overvoltage by the input (IN) of the circuit, and deactivating the overvoltage by the output (OUT) of the circuit.

In another embodiment, the step consisting of creating an overvoltage is implemented with a preliminary step of storing electrical energy in storage means, and a step of selectively releasing the stored energy, by control means.

Advantageously, the step of selectively releasing stored energy by the storage means is implemented at most during the time of propagation of the input signal.

With embodiments of the invention, it is possible to improve the performance of a buffer without penalties in terms of leakage currents. The output of the buffer remains between 0 and VDD, without any particular control signal.

Embodiments of the invention can be implemented, for example, in order to optimize performance at the level of various blocks of a system-on-chip, in particular in order to check all of the time constrains (timing closure) associated with each block under various conditions.

BRIEF DESCRIPTION OF THE DRAWINGS

Other features and advantages of the present invention will become clearer on reading the following description provided for illustrative and non-limiting purposes, in reference to the appended figures of embodiments thereof, in which.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
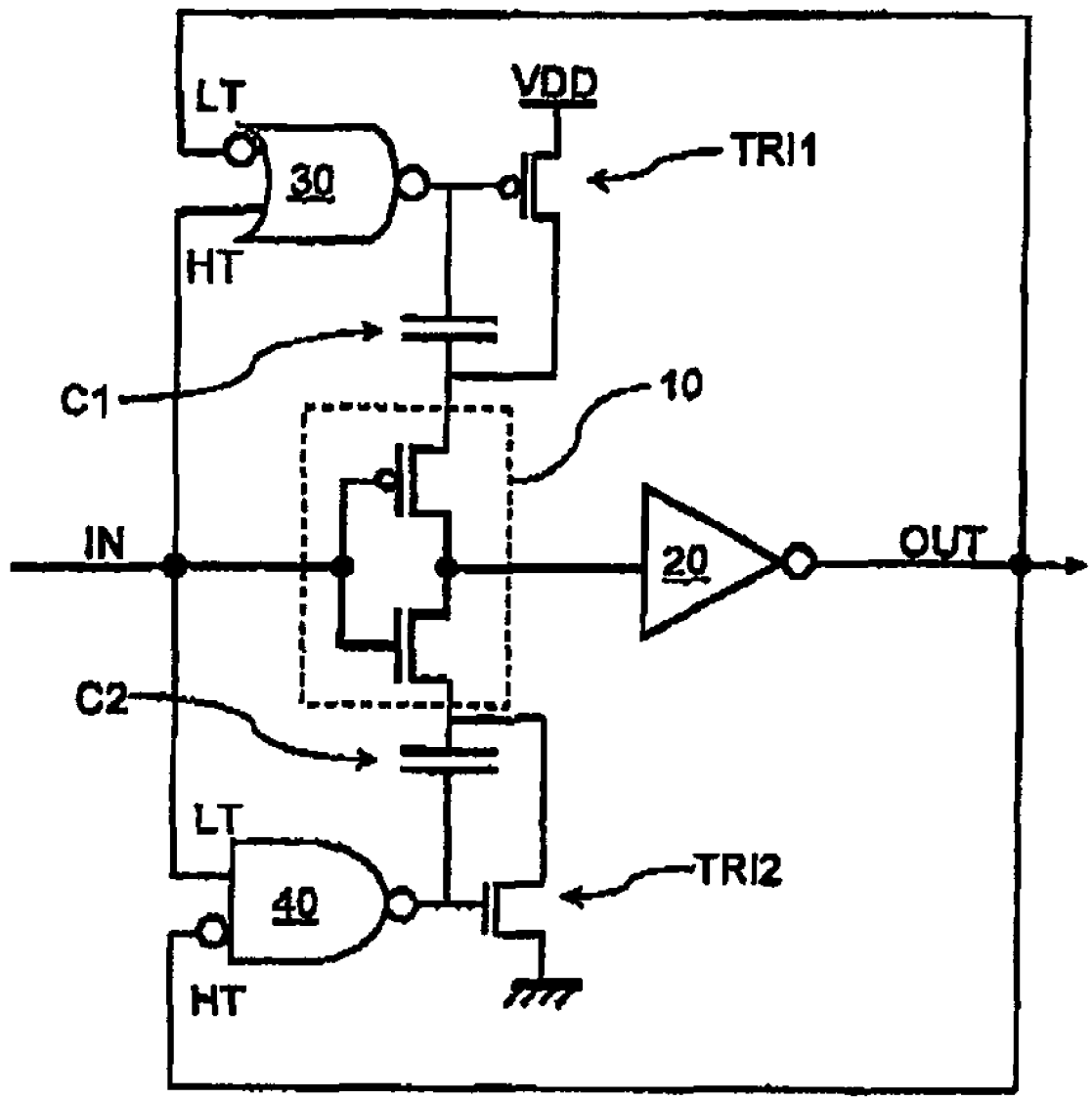
FIG. 1 is a diagram of a circuit according to an embodiment of the invention.

In reference to FIG. 1, a buffer circuit according to an embodiment of the invention includes a first CMOS inverter 10 composed of a first NMOS transistor and a first PMOS transistor, of which the gates are connected to one another and connected to the input IN of the circuit.

It also includes a second CMOS inverter 20 composed of a second NMOS transistor and a second PMOS transistor, of which the gates are connected to one another and connected to the output of the first inverter 10, and of which the output is connected to the output OUT of the circuit.

The circuit according to this embodiment of the invention is powered by a supply voltage VDD. To this end, a first (PMOS) initialization transistor TRI1 is connected in series between a supply source VDD and the first PMOS transistor of the first inverter 10. Similarly, a second (NMOS) initialization transistor TRI2 is connected in series between the ground and the first NMOS transistor of the first inverter 10.

According to an embodiment of the invention, the buffer circuit includes at least one of the following two dual loops:

a first loop includes a first NOR gate 30 and a first capacitor C1.

One of the terminals of the first capacitor C1 is connected to the first PMOS transistor of the first inverter 10 in parallel with the first initialization transistor TRI1, and the other terminal is connected to the output of the first NOR gate 30.

The output of the first NOR gate 30 is also connected to the gate of the first initialization transistor TRI1. One of the inputs of the first NOR gate 30 is connected to the input IN of the circuit and has a high threshold voltage, while the other input of the first NOR gate 30 is connected to the inverted output OUT of the circuit and has a low threshold voltage.

a second loop includes a second NAND gate 40 and a second capacitor C2.

One of the terminals of the second capacitor C2 is connected to the first NMOS transistor of the first inverter 10 in parallel with the second initialization transistor TRI2, and the other terminal is connected to the output of the second NAND gate 40.

The output of the second NAND gate 40 is also connected to the gate of the second initialization transistor TRI2. One of the inputs of the first NAND gate 40 is connected to the input IN of the circuit and has a low threshold voltage, while the other input of the second NAND gate 40 is connected to the inverted output OUT of the circuit and has a high threshold voltage.

The first loop makes it possible to create a controlled overvoltage during a falling edge of the input signal, and the second loop makes it possible to create a controlled overvoltage during a rising edge of the input signal, as described below.

The term "high threshold voltage" in CMOS technology means that the PMOS transistor has a threshold voltage greater than that of its corresponding NMOS transistor. The threshold voltage of the PMOS is preferably twice that of the NMOS.

Similarly, the term "low threshold voltage" means that the threshold voltage of the PMOS is lower than that of the corresponding NMOS.

The threshold of an inverter is higher insofar as the threshold of the NMOS is high and/or the threshold of the PMOS is low.

More precisely, the threshold voltage of the inverter is adjusted by modifying the power ratio between NMOS and PMOS, i.e., by modifying not the threshold voltages of the MOS transistors, but their geometry.

These different threshold voltages are obtained by adjusting the size of the transistors constituting the NOR 30 and NAND 40 gates and the inverters.

Dynamically, in continuous mode, the input IN and the output OUT of the buffer circuit are equal:

When the input IN of the circuit is 0,

On the first loop, the non-inverted input, with a high threshold voltage, of the first NOR gate 30 is 0, and the inverted input, with a low threshold voltage, of the first NOR gate 30 is 1, therefore the output of the first NOR gate is 0, consequently, the first initialization transistor TRI1 is on.

On the second loop, in a dual manner, the non-inverted input, with a low threshold voltage, of the second NAND gate 40 is 0, and the inverted input, with a high threshold voltage, of the second NAND gate 40 is 1, therefore the output of the second NAND gate is 1, consequently, the second initialization transistor TRI2 is on.

When the input IN of the circuit is 1,

On the first loop, the non-inverted input, with a high threshold voltage, of the first NOR gate 30 is 1, and the inverted input, with a low threshold voltage, of the first NOR gate 30 is 0, therefore the output of the first NOR gate is 0, consequently, the first initialization transistor TRI1 is on.

On the second loop, in a dual manner, the non-inverted input, with a low threshold voltage, of the second NAND gate 40 is 1, and the inverted input, with a high threshold voltage, of the second NAND gate 40 is 0, therefore the output of the second NAND gate is 1, consequently, the second initialization transistor TRI2 is on.

In continuous mode, the buffer circuit according to this embodiment of the invention acts as a conventional buffer circuit.

However, in transient mode, i.e., for the time of propagation of the input signal, the value of the input signal at the input of the circuit IN is opposite its value at the output OUT:

When the input IN of the circuit is 0,

On the first loop, the non-inverted input, with a high threshold voltage, of the first NOR gate 30 is 0, and the inverted input, with a low threshold voltage, of the first NOR gate 30 is 0, therefore the output of the first NOR gate is 1, consequently, the first initialization transistor TRI1 is off.

On the second loop, in a dual manner, the non-inverted input, with a low threshold voltage, of the second NAND gate 40 is 0, and the inverted input, with a high threshold voltage, of the second NAND gate 40 is 0, therefore the output of the second NAND gate is 1, consequently, the second initialization transistor TRI2 is on.

When the input IN of the circuit is 1,

On the first loop, the non-inverted input, with a high threshold voltage, of the first NOR gate 30 is 1, and the inverted input, with a low threshold voltage, of the first NOR gate 30 is 1, therefore the output of the first NOR gate is 0, consequently, the first initialization transistor TRI1 is on.

On the second loop, in a dual manner, the non-inverted input, with a low threshold voltage, of the second NAND gate 40 is 1, and the inverted input, with a high threshold voltage, of the second NAND gate 40 is 1, therefore the output of the second NAND gate is 0, consequently, the second initialization transistor TRI2 is off.

The first initialization transistor TRI1 makes it possible to supply the first inverter 10. When it is on, it powers in particular the terminal on the side of the first NOR gate of the first capacitor.

When the output of the first NOR gate 30 changes from 0 to 1, the first initialization transistor TRI1 is cut off and the first capacitor C1 transfers chargers from the first NOR gate 30 to the first inverter 10, and in a dual manner for the second NAND gate 40 and the second capacitor C2.

The release of energy stored by the storage means (capacitors C1 and C2) is therefore controlled by control means (NOR 30 and NAND 40 gates, respectively).

As an overvoltage is bad for the reliability of the circuit, according to embodiments of the invention, it is desirable to create the overvoltage earlier, i.e., to detect the start of an edge as early as possible in order to activate the creation of the overvoltage, and detect the end of an edge as late as possible in order to stop the overvoltage so as to be active only during the transient phase, and as long as possible over this transient phase.

The various high and low threshold voltages at the input of the NOR 30 and NAND 40 gates are created for this purpose.

For example, on the first loop including the first NOR gate 30 and configured to create an overvoltage during falling edges of the input signal, once the circuit detects an operation (change from 1 to 0 of the input signal), it is necessary to create the overvoltage as quickly as possible. The non-inverted input of the first NOR gate 30 (connected to the input IN of the circuit) therefore has a high threshold voltage.

In a dual manner, on the second loop, the non-inverted input of the second NAND gate 40 (connected to the input IN of the circuit) therefore has a low threshold voltage, so as to detect a rising edge as early as possible.

Similarly, to be certain that the operation (change in state of the input signal) is terminated when the overvoltage is stopped, an input with a low threshold voltage is placed for the inverted input of the first NOR gate 30 connected to the output OUT of the circuit; and in a dual manner, an input with a high threshold voltage is placed for the inverted input of the second NAND gate 40 connected to the output OUT of the circuit.

These return loops make it possible to cut the overvoltage and continuously return to a situation of preloading the capacitors C1 and C2 through the dual transistors TRI1 and TRI2, respectively.

Figure 2:
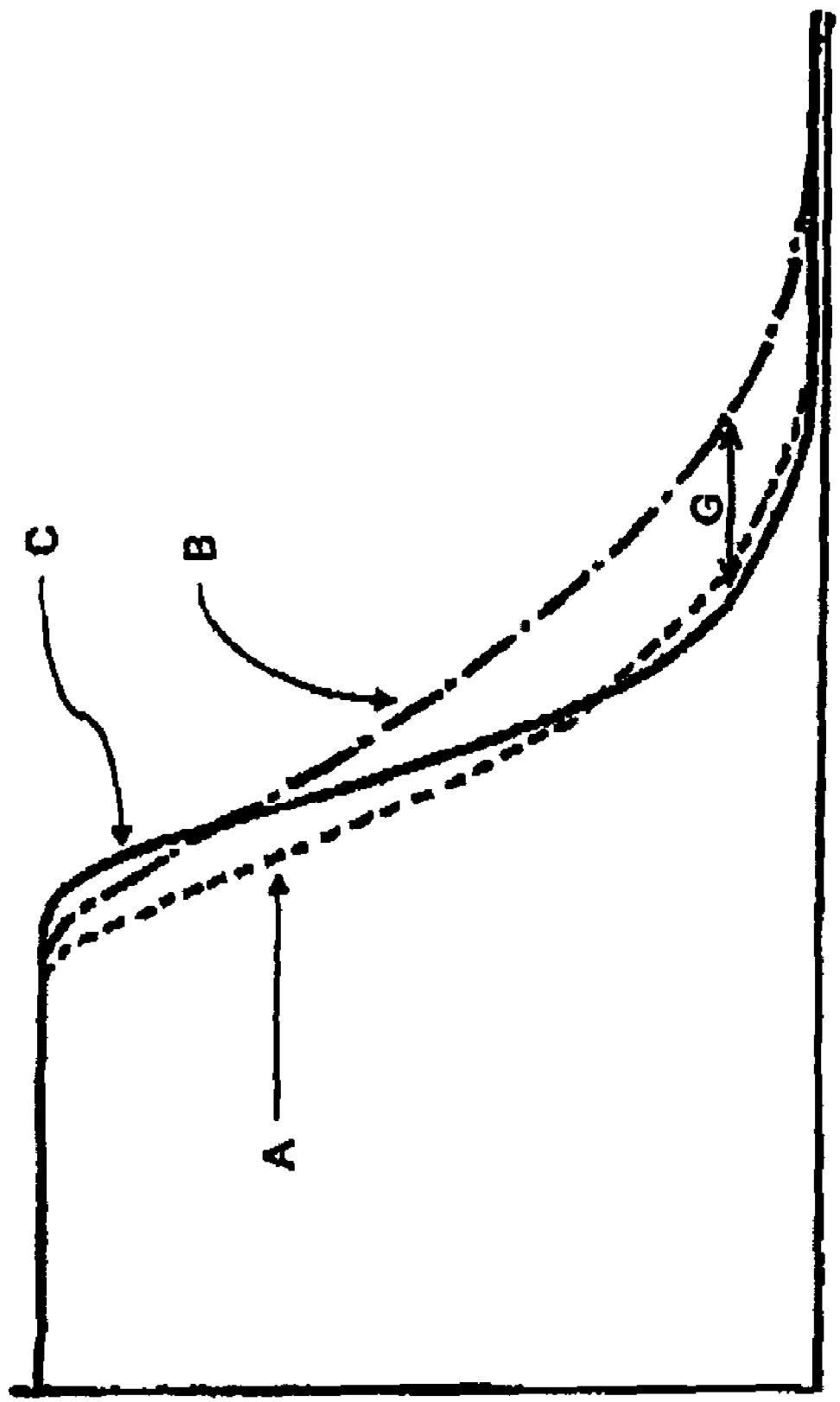
FIG. 2 is a representation of a dynamic behavior of the circuit of FIG. 1.

As shown FIG. 2, this embodiment of the invention makes it possible to accelerate the inversion of the state at the output of the OUT buffer circuit, so that it is again equal to the input value IN.

FIG. 2 shows the behavior of the output OUT of a buffer circuit for two conventional buffer circuits and one embodiment of the invention.

This FIG. 2 shows a falling edge of the output signal, i.e., the value of the voltage at the output OUT of the circuit as a function of time.

In a first circuit shown by curve A, the buffer circuit is a conventional circuit that includes a first inverter composed of transistors with a low threshold voltage. Such a configuration is relatively fast, but presents leakage current problems.

In a second circuit shown by curve B, the buffer circuit is a conventional circuit that includes a first inverter composed of transistors with a standard threshold voltage. Such a configuration is relatively slow.

In a third circuit shown by curve C, and corresponding to one embodiment of the invention, the activation is later than for each of the two conventional circuits above, due to the logic loops, but the transition time is faster (steeper slope) than for each of the two previous embodiments.

As a non-limiting example, with a supply voltage VDD equal to 0.8 V, and a capacitor value C1 equal to 40 fF, the gain G of the invention with respect to a conventional circuit including a first inverter composed of transistors with a standard threshold voltage is 300 ps for the circuit latch.

Thus, with embodiments of the invention, the output slope is "reset". The buffer circuit according to embodiments of the invention is advantageously a self-adjusting circuit that is dependent on the charge at the output, and of which the creation of an overvoltage improves the speed, without adversely affecting the static consumption or the reliability due to the transient overvoltage.

Buffer circuits according to embodiments of the present invention may be utilized in electronic circuitry in a variety of different types of electronic systems, such as computer systems, communications systems, portable devices like cellular telephones and personal digital assistants, and so on.

From the foregoing it will be appreciated that, although specific embodiments of the invention have been described herein for purposes of illustration, various modifications may be made without deviating from the spirit and scope of the invention.

The invention claimed is:

1. A buffer circuit, wherein at least one part is powered by a supply voltage by means of a first initialization transistor, and connected to the ground by means of a second initialization transistor, which circuit is capable of transferring, between an input and an output, an input signal including at least one rising edge and/or one falling edge, and which circuit includes a first CMOS inverter, of which the input is connected to the input of the circuit, and of which the output is mounted in series with the input of a second CMOS inverter, with the output of said second CMOS inverter being connected to the output of the circuit, and wherein the circuit also includes a first loop between the output of said second CMOS inverter and the input of said first CMOS inverter, wherein the first loop includes first means for creating an overvoltage on the two CMOS inverters, and/or a second loop between the output of said second CMOS inverter and the input of said first CMOS inverter, and wherein the second loop includes second means for creating an overvoltage on the two CMOS inverters.

2. The buffer circuit according to claim 1, wherein the value of the overvoltage is less than or equal to twice the value of the supply voltage of the circuit.

3. A buffer circuit, wherein at least one part is powered by a supply voltage by means of a first initialization transistor, and connected to the ground by means of a second initialization transistor, which circuit is capable of transferring, between an input and an output, an input signal including at least one rising edge and/or one falling edge, and which circuit includes a first CMOS inverter, of which the input is connected to the input of the circuit, and of which the output is mounted in series with the input of a second CMOS inverter, with the output of said second CMOS inverter being connected to the output of the circuit, wherein the circuit also includes a first loop between the output of said second CMOS inverter and the input of said first CMOS inverter, wherein the first loop includes first means for creating an overvoltage on the two CMOS inverters, and/or a second loop between the output of said second CMOS inverter and the input of said first CMOS inverter, and wherein the second loop includes second means for creating an overvoltage on the two CMOS inverters, and wherein the first and second means for creating an overvoltage respectively include first and second electrical energy storage means and first and second control means for selectively releasing the energy respectively stored by the first and second storage means.

4. The buffer circuit according to claim 3, wherein the first electrical energy storage means include a first capacitor mounted between the first control means and the first CMOS inverter, and the second electrical storage means include a second capacitor mounted between the second control means and the first CMOS inverter.

5. The buffer circuit according to claim 3, wherein the first control means include a first NOR gate of which the output is connected to the gate of the first initialization transistor, and of which one of the inputs is connected to the input of the circuit, while the other input is connected to the inverted output of the circuit, and the second control means also include a second NAND gate of which the output is connected to the gate of the second initialization transistor, and of which one of the inputs is connected to the input of the circuit, while the other input is connected to the inverted output of the circuit.

6. A buffer circuit, wherein at least one part is powered by a supply voltage by means of a first initialization transistor, and connected to the ground by means of a second initialization transistor, which circuit is capable of transferring, between an input and an output, an input signal including at least one rising edge and/or one falling edge, and which circuit includes a first CMOS inverter, of which the input is connected to the input of the circuit, and of which the output is mounted in series with the input of a second CMOS inverter, with the output of said second CMOS inverter being connected to the output of the circuit, wherein the circuit also includes a first loop between the output of said second CMOS inverter and the input of said first CMOS inverter, wherein the first loop includes first means for creating an overvoltage on the two CMOS inverters, and/or a second loop between the output of said second CMOS inverter and the input of said first CMOS inverter, and wherein the second loop includes second means for creating an overvoltage on the two CMOS inverters, wherein the first and second means for creating an overvoltage respectively include first and second electrical energy storage means and first and second control means for selectively releasing the energy respectively stored by the first and second storage means, and wherein the first and second control means are configured so as to selectively release the energy stored by the first and second storage means at most during the time of propagation of the input signal.

7. The buffer circuit according to claim 3, wherein:

the input connected to the input of the circuit of the first NOR gate has a high threshold voltage, while the input connected to the inverted output of the circuit has a low threshold voltage, and/or the input connected to the input of the circuit of the second NAND gate has a low threshold voltage, while the input connected to the inverted output of the circuit has a high threshold voltage.

8. A method for transferring an input signal including at least one rising edge and/or one falling edge between an input and an output of a buffer circuit powered by a supply voltage, which method includes steps comprising:
inverting the input signal by a first CMOS inverter, of which the input is connected to the input of the circuit, and
inverting the signal at the output of the first inverter by a second CMOS inverter of which the input is series-mounted with the output of the first inverter and the output is connected to the output of the circuit, and
wherein the method also includes steps comprising:
creating an overvoltage on the two CMOS inverters, and activating said overvoltage by the input of the circuit, and deactivating said overvoltage by the output of the circuit.

9. A method for transferring an input signal including at least one rising edge and/or one falling edge between an input and an output of a buffer circuit powered by a supply voltage, which method includes steps comprising:
inverting the input signal by a first CMOS inverter, of which the input is connected to the input of the circuit, and
inverting the signal at the output of the first inverter by a second CMOS inverter of which the input is series-mounted with the output of the first inverter and the output is connected to the output of the circuit,
wherein the method also includes steps comprising:
creating an overvoltage on the two CMOS inverters, and activating said overvoltage by the input of the circuit, and deactivating said overvoltage by the output of the circuit, and
wherein the step consisting of creating an overvoltage is implemented with a preliminary step of storing electrical energy in storage means, and a step of selectively releasing the stored energy, by control means.

10. The method according to claim 9, wherein the step of selectively releasing stored energy by the storage means is implemented at most during the time of propagation of the input signal.

11. A buffer circuit, comprising:
a first inverter having a first input adapted to receive an input signal and having an output, the first inverter having first and second supply nodes;
a second inverter having an second input coupled to the first output and having a second output; and
a first control circuit coupled to the first input and also coupled between the second output and one of the first and second supply nodes, the first control circuit being operable responsive to a transition of the input signal to provide either a supply voltage or an overvoltage having a magnitude greater than a magnitude of the supply voltage on the corresponding first or second supply node.

12. The buffer circuit of claim 11, wherein the supply voltage corresponds to a positive supply voltage and the overvoltage corresponds to a voltage greater than the positive supply voltage.

13. The buffer circuit of claim 12, wherein the overvoltage has a value equal to approximately twice the positive supply voltage.

14. The buffer circuit of claim 11, wherein the supply voltage corresponds to a ground reference voltage and the overvoltage corresponds to a negative voltage having a value less than the ground reference voltage.

15. The buffer circuit of claim 11, wherein the first control circuit is coupled between the second output and the first supply node of the first inverter, and the buffer circuit further comprising:
a second control circuit coupled to the first input and also coupled between the second output and second supply node, the second control circuit being operable responsive to the complementary transition of the input signal to provide either a supply voltage or an overvoltage having a magnitude greater than a magnitude of the supply voltage on the second supply node.

16. The buffer circuit of claim 15, wherein the first control circuit comprises:
a NOR gate having a first input coupled to the first input and a second input coupled to the second output, and having an output;
a first capacitor coupled between the output of the NOR gate and the first supply node; and
a switching element including a first signal node adapted to receive a first supply voltage and a second signal node coupled to the first supply node, and a control node coupled to the output of the NOR gate.

17. The buffer circuit of claim 16, wherein the second control circuit comprises:
a NAND gate having a first input coupled to the first input and a second input coupled to the second output, and having an output;
a first capacitor coupled between the output of the NAND gate and the second supply node; and
a switching element including a first signal node adapted to receive a first reference voltage and a second signal node coupled to the second supply node, and a control node coupled to the output of the NAND gate.

18. The buffer circuit of claim 17, wherein the first input of the NOR gate has a high threshold and the second input has a low threshold and wherein the first input of the NAND gate has low threshold and the second input has a high threshold.

19. An electronic system, comprising:
electronic circuitry including a buffer circuit, the buffer circuit comprising:
a first inverter having a first input adapted to receive an input signal and having an output, the first inverter having first and second supply nodes;
a second inverter having an second input coupled to the first output and having a second output; and
a first control circuit coupled to the first input and also coupled between the second output and one of the first and second supply nodes, the first control circuit being operable responsive to a transition of the input signal to provide either a supply voltage or an overvoltage having a magnitude greater than a magnitude of the supply voltage on the corresponding first or second supply node.

20. The buffer circuit of claim 19, wherein the electronic circuitry comprises computer circuitry.

21. A method of generating a buffered output signal responsive to an input signal using series-connected inverters, each of the inverters including first and second supply nodes adapted to receive first and second supply voltages, and the method comprising:
in response to a first transition of the input signal, providing a first overvoltage on one of the first and second supply nodes of at least one of the series-connected inverters, wherein the first overvoltage has a magnitude greater than a magnitude of the first supply voltage; and in response to a second transition of the input signal, providing a second overvoltage on the other one of the first and second supply nodes of at least one of the series-connected inverters, wherein the second overvoltage has a magnitude greater than a magnitude of the second supply voltage.

22. The method of claim 21, further comprising:

terminating the providing of the first overvoltage responsive to an output of the buffer circuit transitioning to a first level corresponding to the first transition of the input signal; and terminating the providing of the second overvoltage responsive to the output of the buffer circuit transitioning to a second level corresponding to the second transition of the input signal.

23. The method of claim 22, wherein the first level of the output has the same logic level as the input signal after the first transition and wherein the second level of the output has the same logic level as input signal after the second transition.

24. The method of claim 23, wherein the first overvoltage has positive value and the second overvoltage has a negative value.

25. A method of generating a buffered output signal responsive to an input signal using at least series-connected inverters, each of the inverters including first and second supply node and the method comprising:

in response to a first transition of the input signal, providing a first overvoltage on one of the first and second supply nodes of at least one of the series-connected inverters; and in response to a second transition of the input signal, providing a second overvoltage on the other one of the first and second supply nodes of at least one of the series-connected inverters, and wherein providing the first overvoltage comprises boosting a first supply voltage using a first capacitive element; and wherein providing the second overvoltage comprises boosting a second supply voltage using a second capacitive element.

26. The method of claim 25, wherein the first supply voltage comprises a positive supply voltage and wherein the second supply voltage comprises a reference voltage.

* * * * *

UNITED STATES PATENT AND TRADEMARK OFFICE
CERTIFICATE OF CORRECTION

| | | |
|---|---|---|
| PATENT NO. | : 7,795,917 B2 | Page 1 of 1 |
| APPLICATION NO. | : 12/009144 | |
| DATED | : September 14, 2010 | |
| INVENTOR(S) | : Sebastien Barasinski et al. | |

It is certified that error appears in the above-identified patent and that said Letters Patent is hereby corrected as shown below:

- In Claim 4, Column 8, Line 11 of the patent, the text "wherein the first" immediately following the text "The buffer circuit according to claim 3," should begin on a new line.

- In Claim 11, Column 9, Line 49 of the patent, please change the text "an second input" to -- a second input --.

- In Claim 19, Column 10, Line 46 of the patent, please change the text "an second input" to -- a second input --.

- In Claim 23, Column 11, Line 19 of the patent, please change the text "as input signal" to -- as the input signal --.

- In Claim 24, Column 11, Line 21 of the patent, please change the text "has positive value" to -- has a positive value --.

- In Claim 25, Column 12, Line 4 of the patent, please change the text "supply node and the method comprising" to -- supply nodes and the method comprising --.

Signed and Sealed this

Thirtieth Day of November, 2010

David J. Kappos
*Director of the United States Patent and Trademark Office*